(12) United States Patent
Miura

(10) Patent No.: US 11,239,223 B2
(45) Date of Patent: Feb. 1, 2022

(54) SEMICONDUCTOR DEVICE AND MANUFACTURING METHOD THEREOF

(71) Applicant: KIOXIA CORPORATION, Tokyo (JP)

(72) Inventor: Masayuki Miura, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/782,710

(22) Filed: Feb. 5, 2020

(65) Prior Publication Data

US 2021/0082895 A1    Mar. 18, 2021

(30) Foreign Application Priority Data

Sep. 17, 2019   (JP) .............................. JP2019-168746

(51) Int. Cl.
| | |
|---|---|
| *H01L 25/18* | (2006.01) |
| *H01L 23/24* | (2006.01) |
| *H01L 23/00* | (2006.01) |
| *H01L 25/00* | (2006.01) |

(52) U.S. Cl.
CPC .............. *H01L 25/18* (2013.01); *H01L 23/24* (2013.01); *H01L 24/16* (2013.01); *H01L 24/73* (2013.01); *H01L 24/81* (2013.01); *H01L 24/83* (2013.01); *H01L 25/50* (2013.01); *H01L 2224/16225* (2013.01); *H01L 2224/73253* (2013.01); *H01L 2224/73265* (2013.01)

(58) Field of Classification Search
CPC ......... H01L 25/18; H01L 23/24; H01L 24/16; H01L 24/73; H01L 24/81; H01L 24/83; H01L 25/50; H01L 2224/16225; H01L 2224/73253; H01L 2224/73265

See application file for complete search history.

(56) References Cited

U.S. PATENT DOCUMENTS

| | | | |
|---|---|---|---|
| 2002/0096785 A1* | 7/2002 | Kimura | H01L 25/0657 257/778 |
| 2004/0159925 A1* | 8/2004 | Matsuura | H05K 1/181 257/678 |
| 2013/0114323 A1 | 5/2013 | Shindo et al. | |
| 2016/0276312 A1 | 9/2016 | Shimizu et al. | |
| 2017/0012031 A1* | 1/2017 | Lim | H01L 21/565 |
| 2017/0025385 A1* | 1/2017 | Song | H01L 23/562 |

(Continued)

FOREIGN PATENT DOCUMENTS

| | | |
|---|---|---|
| JP | 5840479 B2 | 1/2016 |
| TW | 200837922 A | 9/2008 |

*Primary Examiner* — Douglas W Owens
(74) *Attorney, Agent, or Firm* — Foley & Lardner LLP

(57) ABSTRACT

In a semiconductor device, a substrate has a main surface. A first semiconductor chip has a first front surface and a first back surface, and is mounted on the main surface via a plurality of bump electrodes. A first spacer has a second front surface and a second back surface that is mounted on the main surface. A height of the second front surface from the main surface is within a range between a highest height and a lowest height of the first back surface from the main surface. A second spacer has a third front surface and a third back surface that is mounted on the main surface. A height of the third front surface from the main surface is within the range between the highest height and the lowest height of the first back surface from the main surface.

11 Claims, 12 Drawing Sheets

(56) References Cited

U.S. PATENT DOCUMENTS

| | | | |
|---|---|---|---|
| 2017/0040308 A1* | 2/2017 | Ko | H01L 21/78 |
| 2019/0198452 A1* | 6/2019 | Ono | H01L 23/3135 |
| 2019/0326222 A1* | 10/2019 | Chavali | H01L 23/5384 |
| 2020/0006274 A1* | 1/2020 | Chiang | H01L 21/568 |
| 2020/0135601 A1* | 4/2020 | Hsieh | H01L 25/18 |
| 2020/0365544 A1* | 11/2020 | Chen | H01L 25/18 |
| 2021/0020610 A1* | 1/2021 | Zhong | H01L 23/24 |
| 2021/0036682 A1* | 2/2021 | Kamgaing | H01L 27/20 |

* cited by examiner

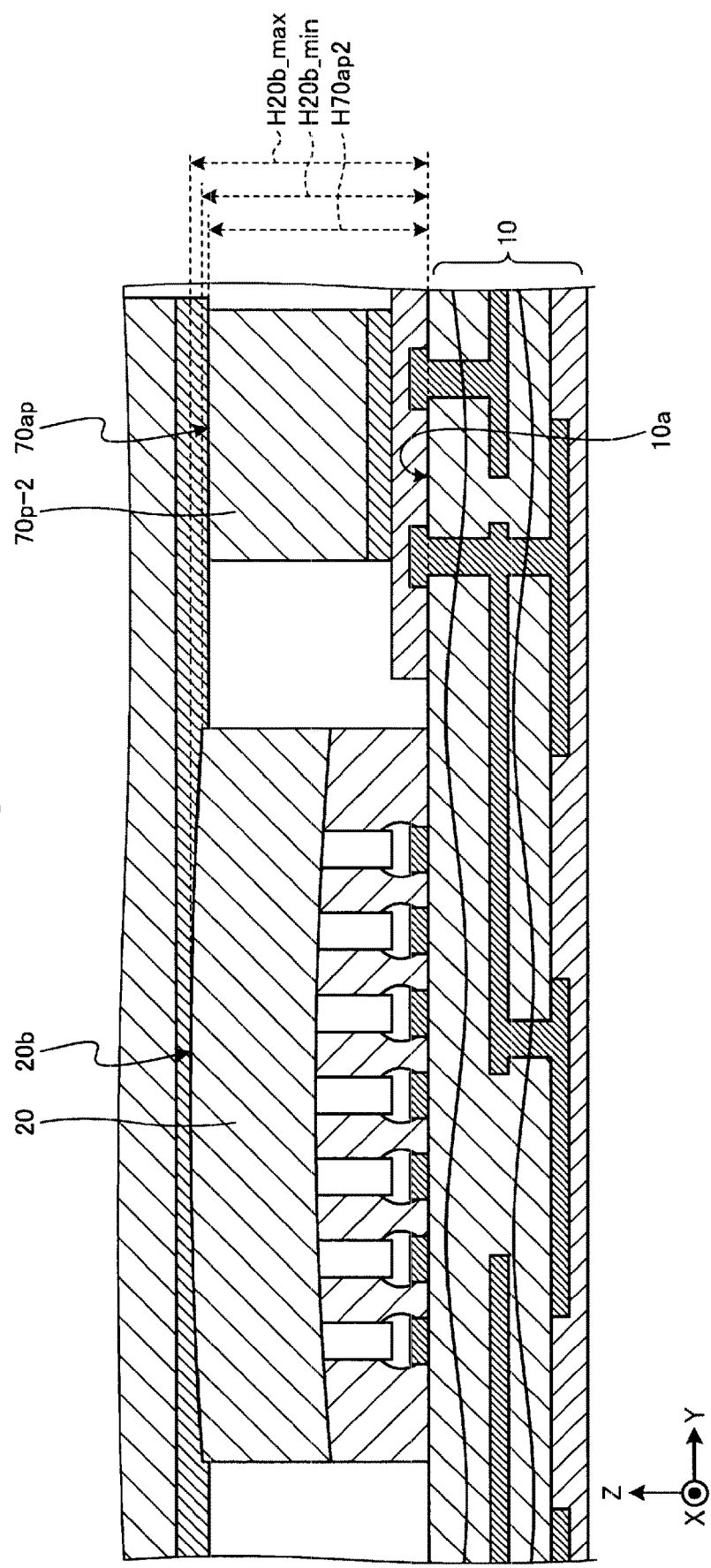

SEMICONDUCTOR DEVICE AND MANUFACTURING METHOD THEREOF

CROSS-REFERENCE TO RELATED APPLICATION(S)

This application claims the benefit of and priority to Japanese Patent Application No. 2019-168746, filed Sep. 17, 2019, the entire contents of which are incorporated herein by reference.

FIELD

Embodiments described herein relate generally to a semiconductor device and a manufacturing method of the semiconductor device.

BACKGROUND

In a semiconductor device, a semiconductor chip and a spacer are mounted on a main surface of a substrate, a plurality of other semiconductor chips are mounted on the spacer, and a mounting form of a spacer structure is formed. At this time, it is desired to appropriately constitute the mounting form of the spacer structure.

DESCRIPTION OF THE DRAWINGS

FIG. 12 is an enlarged cross-sectional view showing the heights of the spacer and the controller chip according to the modification of the second embodiment.

DETAILED DESCRIPTION

Figure 1:
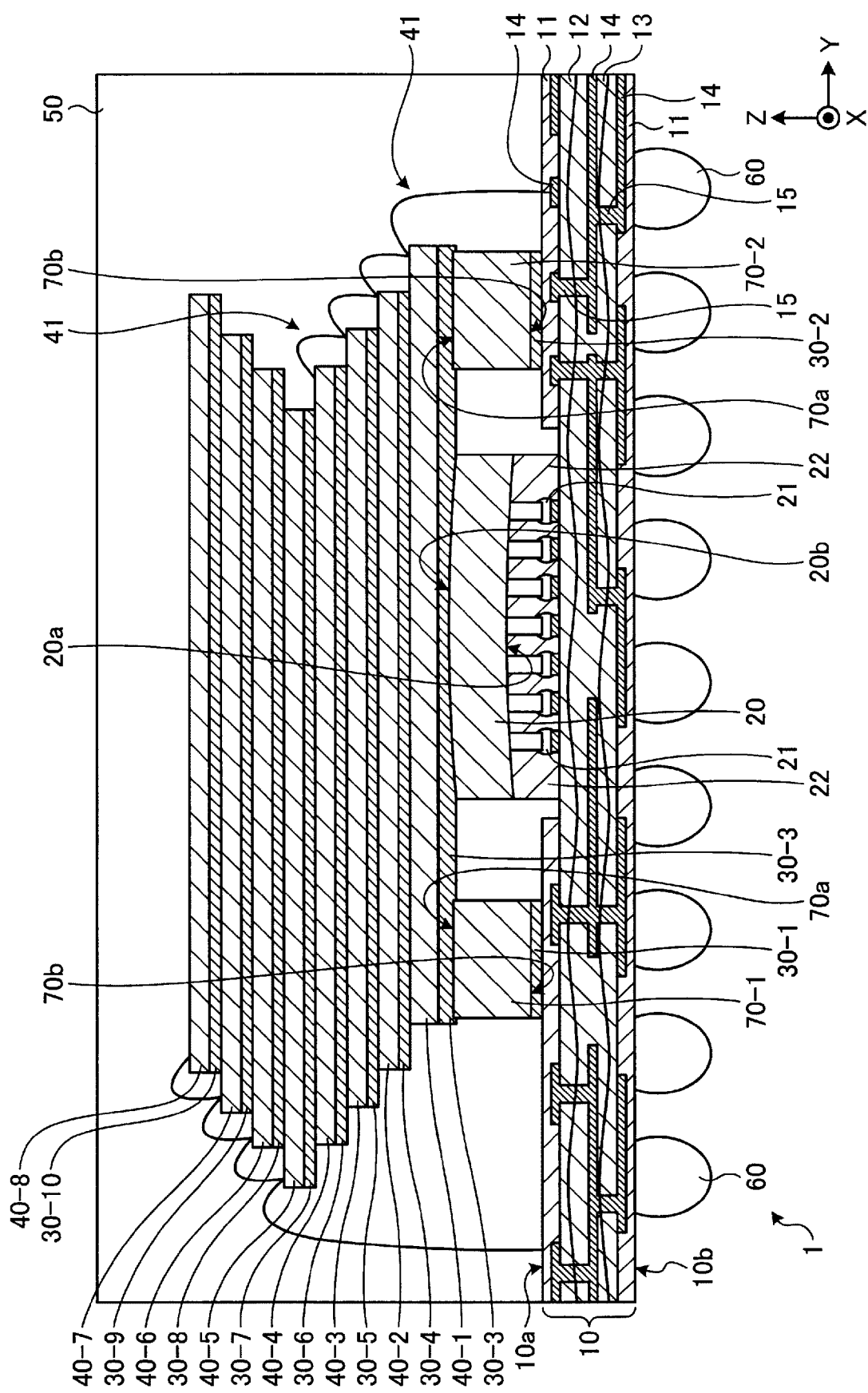
FIG. 1 is a cross-sectional view showing a configuration of a semiconductor device according to a first embodiment.

Embodiments provide a semiconductor device and a manufacturing method of the semiconductor device that can appropriately constitute a mounting form of a spacer structure.

In general, according to one embodiment, a semiconductor device may include a substrate, a controller chip, a first spacer, and a second spacer. The substrate may have a main surface. The controller chip may have a first front surface and a first back surface. The controller chip may be mounted on the main surface in a state where the first surface faces the main surface via a plurality of bump electrodes. The first spacer may have a second front surface and a second back surface. The second back surface of the first spacer may be mounted on the main surface. A height of the second surface of the first spacer from the main surface may be within a range between an upper limit and a lower limit of a height of the first back surface from the main surface. A second spacer may have a third front surface and a third back surface. The third back surface of the second spacer may be mounted on the main surface. A height of the third surface of the second spacer from the main surface may be within the range between the upper limit and the lower limit of the height of the first back surface from the main surface.

Hereinafter, a semiconductor device according to an embodiment will be described in detail with reference to attached drawings. The present disclosure is not limited to the following embodiments.

First Embodiment

A semiconductor device according to the first embodiment may employ a multi-chip module configuration in which a controller chip and a plurality of memory chips are mounted in a mixed manner in order to satisfy a requirement of System In Package (SIP). In the multi-chip module configuration, a chip area of the controller chip may be reduced to be small in response to a demand of increasing speed and reducing power consumption, whereas a chip area of the memory chips tends to be large in response to a demand of increasing a capacity. In the semiconductor device, a spacer structure in which the plurality of chips are stacked vertically and an area difference between the controller chip and the memory chips is filled with a spacer may be employed in response to a demand for compact mounting.

For example, the controller chip may be face-up mounted on a surface (a main surface) having the largest area of the substrate by a wire bond method with a plurality of spacers mounted in periphery, and the plurality of memory chips may be stacked on the controller chip and the spacers via an adhesive film and face-up mounted on the substrate by the wire bond method. The spacer structure will be referred to as a face-up mounting+face-up mounting spacer structure.

In the face-up mounting+face-up mounting spacer structure, a gap space for a bonding wire of the controller chip between the controller chip and the lowermost memory chip may be provided. Therefore, a mounting height from the substrate to the uppermost memory chip for mounting a specified number of memory chips is likely to be high.

Alternatively, the controller chip may be face-down mounted on the main surface of the substrate by a flip-chip method with the plurality of spacers mounted in periphery, and the plurality of memory chips may be stacked on the controller chip and the spacers via an adhesive film and face-up mounted on the substrate by the wire bond method. The spacer structure will be referred to as a face-down mounting+face-up mounting spacer structure.

In the face-down mounting+face-up mounting spacer structure, it is not necessary for a gap space for a bonding wire of the controller chip between the controller chip and the lowermost memory chip. Therefore, in the face-down mounting+face-up mounting spacer structure, the mounting height from the substrate to the uppermost memory chip for mounting a specified number of memory chips can be reduced as compared with that of the face-up mounting and the face-up mounting spacer structure.

In the semiconductor device having the face-down mounting+the face-up mounting spacer structure, when the controller chip is thinned in accordance with a demand for further compact packaging, the controller chip may be affected by thermal deformation or the like at the time of mounting and may be bent. At this time, when a difference in height between a back surface of the controller chip and a front surface of the spacers on the substrate is large, a thickness of the adhesive film to be stacked thereon would be greatly increased in order to eliminate the difference in height, and the mounting height from the substrate to the uppermost memory chip may be increased.

Therefore, in the present embodiment, the height of each spacer from the main surface of the substrate may be within a range between an upper limit and a lower limit of the height of the controller chip in the semiconductor device having the face-down mounting+the face-up mounting spacer structure, so that the thickness of the adhesive film and the consequential mounting height are reduced.

Specifically, a semiconductor device 1 may be constituted as shown in FIG. 1. FIG. 1 is a view showing a configuration of the semiconductor device 1.

The semiconductor device 1 includes a substrate 10, a controller chip 20, a plurality of memory chips 40-1 to 40-8, a sealing resin 50, external electrodes 60, a plurality of spacers 70-1 and 70-2, and a plurality of adhesive films 30-1 to 30-10. Hereinafter, a direction perpendicular to a surface having the largest area of the substrate 10 (a front surface 10a, a first main surface) is defined as a Z direction, and two directions orthogonal to each other in a plane perpendicular to the Z direction are defined as an X direction and a Y direction.

In the semiconductor device 1, the controller chip 20 and the plurality of memory chips 40-1 to 40-8 are stacked successively on the substrate 10, and the plurality of spacers 70-1 and 70-2 are arranged to lateral sides of the controller chip 20 between a lowest memory chip 40-1 among the plurality of memory chips 40-1 to 40-8 and the substrate 10. The controller chip 20 is flip-chip mounted on the substrate 10 in a face-down state, and the plurality of memory chips 40-1 to 40-8 are wire-bonded to the substrate 10 in a face-up state. Accordingly, a face-down mounting+face-up mounting spacer structure is formed.

The substrate 10 has the front surface (a main surface) 10a on a +Z side and a back surface 10b on a −Z side. The controller chip 20, the plurality of spacers 70-1 and 70-2, the plurality of memory chips 40-1 to 40-8, and the plurality of adhesive films 30-1 to 30-10 are mounted on the front surface 10a of the substrate 10, and the external electrodes 60 are mounted on the back surface 10b of the substrate 10. The controller chip 20, the plurality of spacers 70-1 and 70-2, the plurality of memory chips 40-1 to 40-8, and the plurality of adhesive films 30-1 to 30-10 mounted on a front surface 10a side of the substrate 10 are sealed by the sealing resin 50. The sealing resin 50 may be formed of a material containing an insulating material as a main component. For example, the sealing resin 50 may be formed of a material containing a first resin having an insulating and thermoplastic property as the main component. The external electrodes 60 mounted on a back surface 10b side of the substrate 10 may be formed of a material containing a conductive material as a main component, and surfaces of the external electrodes 60 may be exposed and may be electrically connected from the outside.

The substrate 10 includes solder resist layers 11, a prepreg layer 12, a core layer 13, conductive layers 14, and through-hole electrodes 15. The solder resist layers 11 may be formed of a material containing an insulating material (for example, an insulating organic material) as a main component. The prepreg layer 12 may be formed of a material containing an insulating material (for example, an insulating resin) as a main component. The core layer 13 may be formed of a material containing an insulating material (for example, an insulating resin) as a main component. The conductive layers 14 may be formed of a material containing a conductive material (for example, copper) as a main component. The through-hole electrodes 15 may be formed of a material containing a conductive material (for example, copper) as a main component.

The controller chip 20 has a front surface 20a on the −Z side and a back surface 20b on the +Z side. The controller chip 20 may be mounted on the substrate 10 by the flip-chip method. The front surface 20a of the controller chip 20 faces the front surface 10a of the substrate 10. The controller chip 20 is mounted on the front surface 10a of the substrate 10 via a plurality of bump electrodes 21 in a face-down manner (the flip-chip method). That is, the controller chip 20 is mounted on the front surface 10a of the substrate 10 via the plurality of bump electrodes 21 in a state where the front surface 20a faces the front surface 10a of the substrate 10. Gaps between the plurality of bump electrodes 21 in a space sandwiched between the controller chip 20 and the substrate 10 are filled with an adhesive resin (an underfill) 22.

The controller chip 20 may be mainly formed of a material containing a semiconductor (for example, silicon) as a main component. The bump electrodes 21 may be formed of a material containing a metal (for example, copper) as a main component. The adhesive resin 22 may be formed of a material containing an insulating material as a main component. For example, the adhesive resin 22 may be formed of a material containing a second resin with an insulating and adhesive property as the main component (for example, a material containing epoxy resin as the main component).

Figure 2:
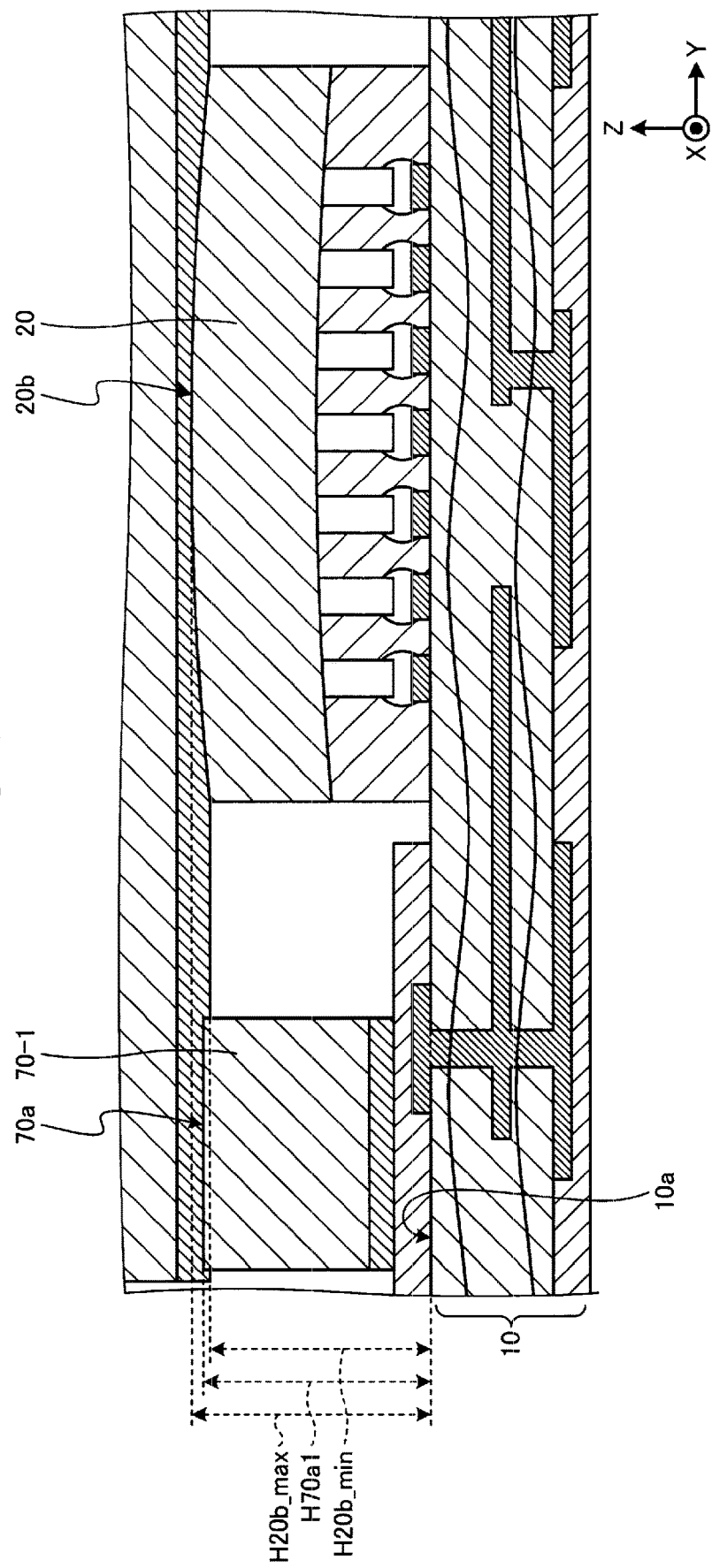
FIG. 2 is an enlarged cross-sectional view showing heights of a spacer and a controller chip according to the first embodiment.
Figure 3:
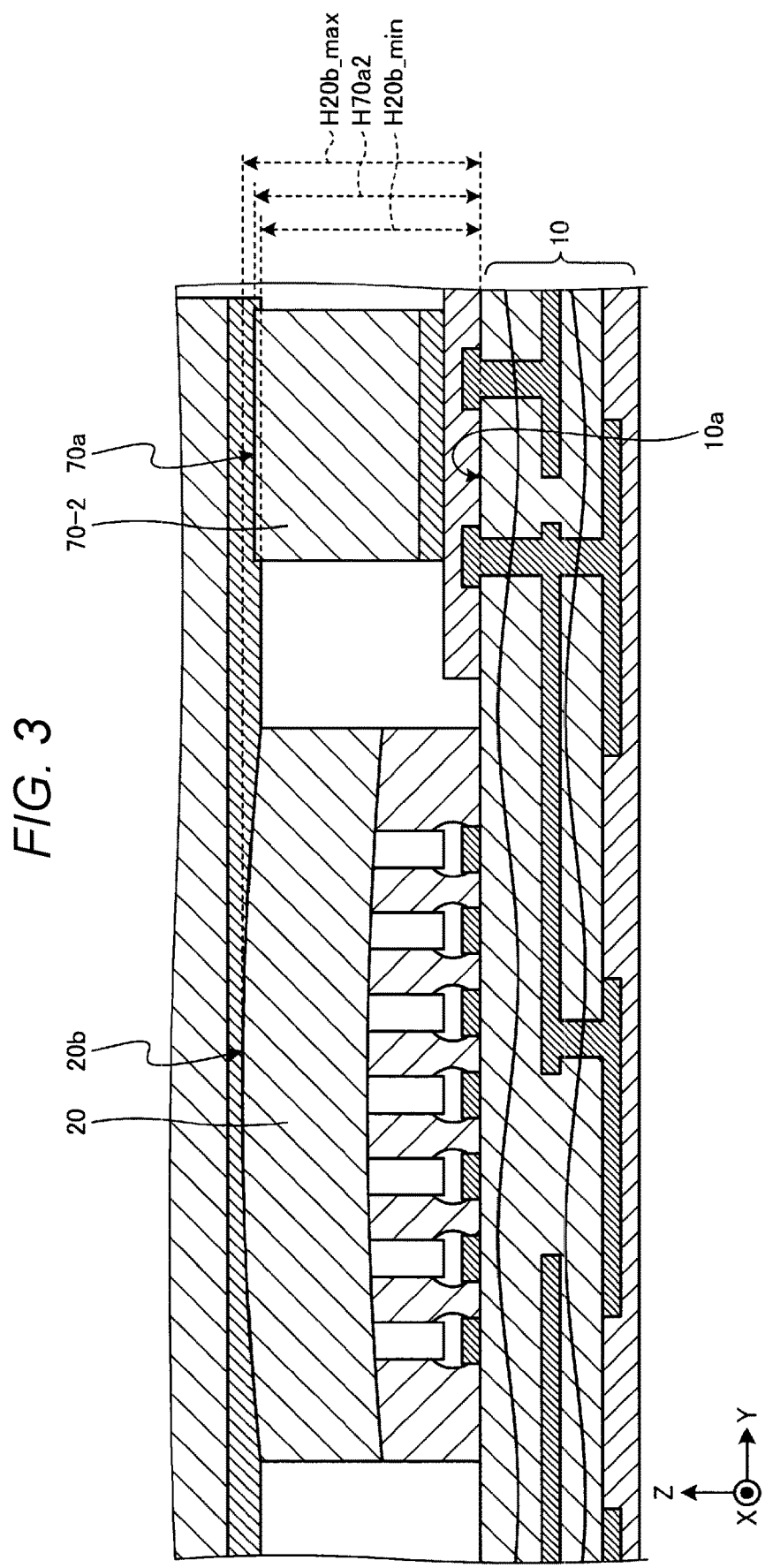
FIG. 3 is an enlarged cross-sectional view showing the heights of the spacer and the controller chip according to the first embodiment.

For example, as shown in FIG. 2 and FIG. 3, the back surface 20b of the controller chip 20 may be bent to protrude toward the +Z side due to an influence of thermal deformation or the like at the time of mounting. FIG. 2 and FIG. 3 are enlarged cross-sectional views showing heights of spacers 70 and the controller chip 20. The back surface 20b of the controller chip 20 has an upper limit height H20b_max and a lower limit height H20b_min for a height from the front surface 10a of the substrate 10. The back surface 20b has the upper limit height H20b_max at a position near a center in the Y direction, and has the lower limit height H20b_min at an end on the +Y side and an end on the −Y side.

Although FIG. 2 and FIG. 3 illustrate a case where the substrate 10 is flat, a criterion of the height from the front surface 10a of the substrate 10 may adopt a Z position where the controller chip 20 is mounted on the front surface 10a when the substrate 10 itself is bent due to thermal deformation and the like during mounting.

The adhesive film 30-1 shown in FIG. 1 covers the front surface 10a of the substrate 10, and the spacer 70-1 is stacked. The adhesive film 30-1 is arranged in periphery of the controller chip 20, for example, on the −Y side relative to the controller chip 20. The adhesive film 30-1 may mediate or cause the spacer 70-1 to be adhered to the surface 10a of the substrate 10. The adhesive film 30-1 is also referred to as a Die Attach Film (DAF) or a Die Bonding Film (DBF).

The spacer 70-1 has a front surface 70a and a back surface 70b. In the spacer 70-1, the back surface 70b is mounted on the front surface 10a of the substrate 10 via the adhesive film 30-1, and the memory chip 40-1 is stacked on the front surface 70a via the adhesive film 30-3. The spacer 70-1 may be formed of a material having sufficient strength to support the memory chip 40-1 on the +Z side of the substrate 10 via the adhesive film 30-3. The spacer 70-1 may be formed of a material containing a semiconductor (for example, silicon) as a main component, or may be formed of a material containing a resin (for example, polyimide resin) as a main component.

For example, as shown in FIG. 2, a height H70a1 of the surface 70a of the spacer 70-1 from the front surface 10a of the substrate 10 may be within a range between the upper limit height H20b_max and the lower limit height H20b_min. Accordingly, the height of the spacer 70-1 may be substantially the same as the height of the controller chip 20.

The adhesive film 30-2 shown in FIG. 1 covers the front surface 10a of the substrate 10, and the spacer 70-2 is stacked. The adhesive film 30-2 is arranged in periphery of the controller chip 20, for example, on the +Y side relative to the controller chip 20. The adhesive film 30-2 may mediate or cause the spacer 70-2 to be adhered to the surface 10a of the substrate 10. The adhesive film 30-2 is also referred to as a Die Attach Film (DAF) or a Die Bonding Film (DBF).

The spacer 70-2 has the front surface 70a and the back surface 70b. In the spacer 70-2, the back surface 70b is mounted on the front surface 10a of the substrate 10 via the adhesive film 30-2, and the memory chip 40-1 is stacked on the front surface 70a via the adhesive film 30-2. The spacer 70-2 may be formed of a material having sufficient strength to support the memory chip 40-1 on the +Z side of the substrate 10 via the adhesive film 30-3. The spacer 70-2 may be formed of a material containing a semiconductor (for example, silicon) as a main component, or may be formed of a material containing a resin (for example, polyimide resin) as a main component.

For example, as shown in FIG. 3, a height H70a2 of the surface 70a of the spacer 70-2 from the front surface 10a of the substrate 10 is within the range between the upper limit height H20b_max and the lower limit height H20b_min. Accordingly, the height of the spacer 70-2 may be substantially the same as the height of the controller chip 20. The height of the spacer 70-2 may be equal to the height of the spacer 70-1.

The adhesive film 30-3 shown in FIG. 1 covers the back surface 20b of the controller chip 20, the surface 70a of the spacer 70-1, and the surface 70a of the spacer 70-2, and the memory chip 40-1 is stacked. The adhesive film 30-3 is disposed among the controller chip 20, the plurality of spacers 70-1 and 70-2, and the memory chip 40-1. The adhesive film 30-3 may bond the memory chip 40-1 to the controller chip 20 and the plurality of spacers 70-1 and 70-2, and is also referred to as a Die Attach Film (DAF) or a Die Bonding Film (DBF).

For example, as shown in FIG. 2 and FIG. 3, since the height of the spacer 70-1 may be substantially the same as the height of the controller chip 20 and the height of the spacer 70-2 may be substantially the same as the height of the controller chip 20, a thickness of the adhesive film 30-3 can be easily reduced. For example, the thickness of the adhesive film 30-3 may be obtained by adding a predetermined thickness margin to a difference ($\Delta H20b = H20b\_max - H20b\_min$) between the upper limit height H20b_max and the lower limit height H20b_min of the controller chip 20.

The plurality of memory chips 40-1 to 40-8 are stacked on the +Z side of the controller chip 20 and the plurality of spacers 70-1 and 70-2. The memory chips 40-1 to 40-8 are arranged across the controller chip 20 and at least one spacer 70. FIG. 1 exemplifies a configuration in which the memory chips 40-1 to 40-8 are arranged across the controller chip 20 and two spacers 70. The adhesive films 30-4 to 30-10 are interposed between the memory chips 40-1 to 40-8, and the memory chips 40-1 to 40-8 are adhered to each other via the adhesive films 30-4 to 30-10.

Each of the memory chips 40-1 to 40-8 has a front surface and a back surface. The back surface of each of the memory chips 40-1 to 40-8 may be adhered to an adhesive film 30, and the front surface of each of the memory chips 40-1 to 40-8 may be provided with an electrode pad. Each of the memory chips 40-1 to 40-8 may be mainly formed of a material containing a semiconductor (for example, silicon) as a main component.

Each of the plurality of memory chips 40-1 to 40-8 may be mounted on the substrate 10 by the wire bond method. At this time, the conductive layer 14 in the substrate 10 may have a plurality of electrode patterns on the surface (the main surface on the +Z side) 10a, and electrode pads of the memory chips 40-1 to 40-8 may be electrically connected to the electrode patterns on the surface of the substrate 10 via bonding wires 41. Accordingly, the plurality of memory chips 40-1 to 40-8 may be mounted on the substrate 10 in a spacer structure by the wire bond method.

In the semiconductor device 1, when thicknesses of the adhesive films 30-1 to 30-10 are compared, as shown in FIG. 1, the thickness of the adhesive film 30-3 may be equal to or slightly larger than the thicknesses of the adhesive film 30-1 and the adhesive film 30-2. The thickness of the adhesive film 30-3 may be equal to or slightly larger than the thicknesses of the adhesive films 30-4 to 30-10. That is, the mounting height of the semiconductor device 1 may be easily reduced if the thickness of the adhesive film 30-3 can be reduced to the same level as the thickness of each of the adhesive films 30-4 to 30-10 among the plurality of memory chips 40-1 to 40-8.

Each of the adhesive films 30-1 to 30-10 may be formed of a material containing an insulating material as a main component. For example, each of the adhesive films 30-1 to 30-10 may be formed of a material containing a third resin with an insulating and adhesive property as the main component (for example, a material including an acrylic polymer and an epoxy resin).

As described above, in the semiconductor device 1 having the face-down mounting+face-up mounting spacer structure in the first embodiment, the height of each of the spacers 70-1 and 70-2 from the front surface 10a of the substrate 10 may be set to be within the range between the upper limit and the lower limit of the height of the controller chip 20. Accordingly, the mounting height of the semiconductor device 1 can be easily reduced since the adhesive film 30-3 can be easily thinned.

The controller chip 20 may be bent to protrude toward the −Z side. In this case, the same effect as that of the embodiment can be achieved by setting the height of each of the spacers 70-1 and 70-2 from the front surface 10a of the substrate 10 to be within the range between the upper limit and the lower limit of the height of the controller chip 20.

Figure 4:
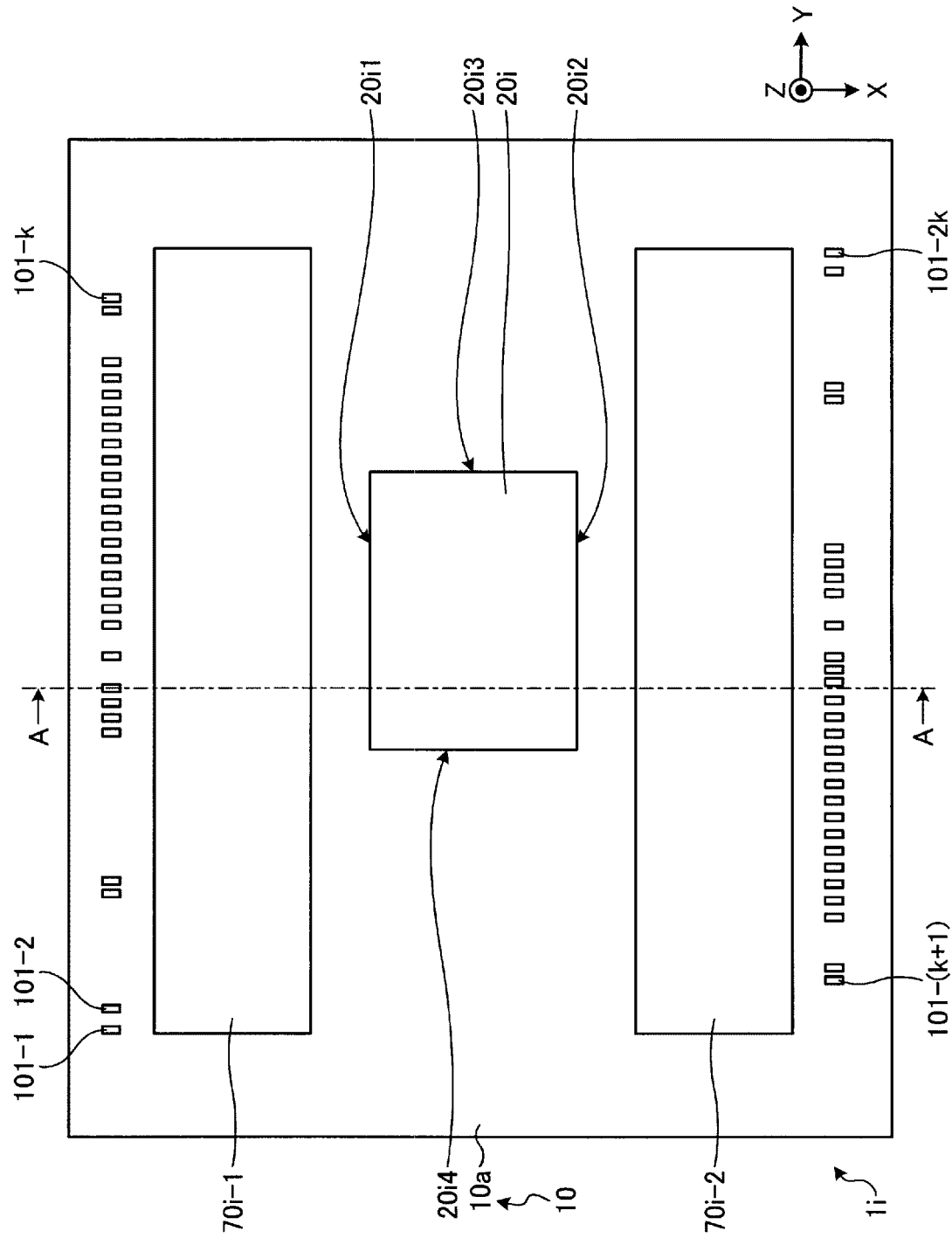
FIG. 4 is a plan view showing a layout configuration of a spacer and a controller chip according to a first modification of the first embodiment.

Alternatively, in a semiconductor device 1i, a plurality of spacers 70i-1 and 70i-2 may be laid out as shown in FIG. 4. FIG. 4 is a plan view showing a layout configuration of the spacers 70i-1 and 70i-2 and a controller chip 20i according to a first modification of the first embodiment.

The controller chip 20i may be arranged in a region including a center of the front surface 10a of the substrate 10 in an XY plane view. Areas of the spacers 70i-1 and 70i-2 may be equal to each other. The spacer 70i-1 is disposed on the −X side relative to the controller chip 20i. The spacer 70i-2 is disposed on the +X side relative to the controller chip 20i.

Figure 5:
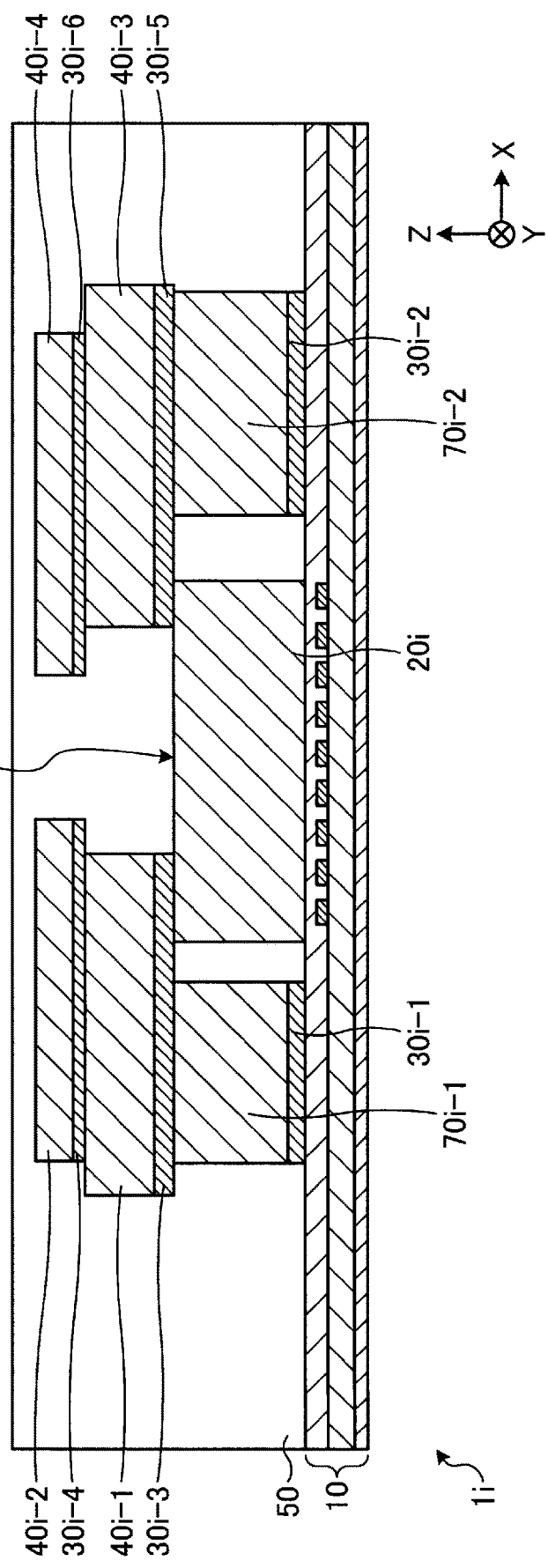
FIG. 5 is a cross-sectional view showing a stacked structure of the spacer, the controller chip, and a memory chip according to the first modification of the first embodiment.

At this time, as shown in FIG. 5, a plurality of memory chips 40i-1 and 40i-2 may also be stacked on the +Z side of the spacer 70i-1 and the controller chip 20i via adhesive films 30i-3 and 30i-4. The spacer 70i-1 and the spacer 70i-2 may be stacked on the +Z side of the substrate 10 via adhesive films 30i-1 and 30i-2, respectively. The plurality of memory chips 40i-3 and 40i-4 may also be stacked on the +Z side of the spacer 70i-2 and the controller chip 20i via adhesive films 30i-5 and 30i-6. FIG. 5 is a cross-sectional view showing a stacked structure of the spacers 70i-1 and 70i-2, the controller chip 20i, and the memory chips 40i-1 to 40i-4 according to the first modification of the first embodiment, and shows a cross section corresponding to a case where the cross section is cut along a line A-A of FIG. 4. In FIG. 5, illustration of bonding wires is omitted for simplification.

The spacer 70i-1 may be formed of a material having sufficient strength to support the memory chip 40i-1 via the adhesive film 30i-3. The spacer 70i-1 may be formed of a material containing a semiconductor (for example, silicon) as a main component, or may be formed of a material containing a resin (for example, polyimide resin) as a main component. The spacer 70i-2 may be formed of a material having sufficient strength to support the memory chip 40i-3 via the adhesive film 30i-5. The spacer 70i-2 may be formed of a material containing a semiconductor (for example, silicon) as a main component, or may be formed of a material containing a resin (for example, polyimide resin) as a main component.

Each of the memory chips 40i-1 to 40i-4 may be electrically connected to a plurality of electrode patterns 101-1 to 101-2k (k is an integer of 2 or more) on the front surface 10a of the substrate 10 shown in FIG. 4 via bonding wires. In the XY plane view, the spacer 70i-1 is disposed between the plurality of electrode patterns 101-1 to 101-k and the controller chip 20i. The spacer 70i-2 is disposed between a plurality of electrode patterns 101-(k+1) to 101-2k and a controller chip 20i.

The controller chip 20i may have, for example, a rectangular outer shape and an outer edge of the controller chip 20i (as shown in FIG. 4, for example) has four sides 20i1 to 20i4. The side 20i1 may extend in the Y direction and face the side 20i2 while being separated therefrom in the X direction, and intersect the sides 20i3 and 20i4 at both ends in the ±Y direction. The side 20i2 may extend in the Y direction and face the side 20i1 while being separated therefrom in the X direction, and intersect the sides 20i3 and 20i4 at both ends in the ±Y direction. The side 20i3 may extend in the X direction and face the side 20i4 while being separated therefrom in the Y direction, and intersect the sides 20i2 and 20i1 at both ends in the ±X direction. The side 20i4 may extend in the X direction and faces the side 20i3 while being separated therefrom in the Y direction, and intersect the sides 20i2 and 20i1 at both ends in the ±X direction.

The spacer 70i-1 is disposed parallel to the side 20i1. The spacer 70i-1 may have a rectangular outer shape whose longitudinal direction is in the Y direction, and extends along the side 20i1. The spacer 70i-2 is disposed parallel to the side 20i2. The spacer 70i-2 may have a rectangular outer shape whose longitudinal direction is in the Y direction, and extends along the side 20i2. Outer shape dimensions of the spacer 70i-1 and the spacer 70i-2 may be equal to each other. The areas of the spacer 70i-1 and the spacer 70i-2 may be equal to each other.

In this way, in the semiconductor device 1i, can use efficiency of the material (for example, a semiconductor such as silicon) of the spacer 70i-1 and the spacer 70i-2 can be improved since the areas of the spacer 70i-1 and the spacer 70i-2 may be equal to each other.

In addition, by setting the outer shape dimensions of the spacer 70i-1 and the spacer 70i-2 to be equal to each other, a variation of the thicknesses of the spacer 70i-1 and the spacer 70i-2 can be reduced. From this point of view, the thicknesses of the adhesive films 30i-3 and 30i-5 can be reduced, and accordingly a mounting height of the semiconductor device 1i may be easily reduced.

Figure 6:
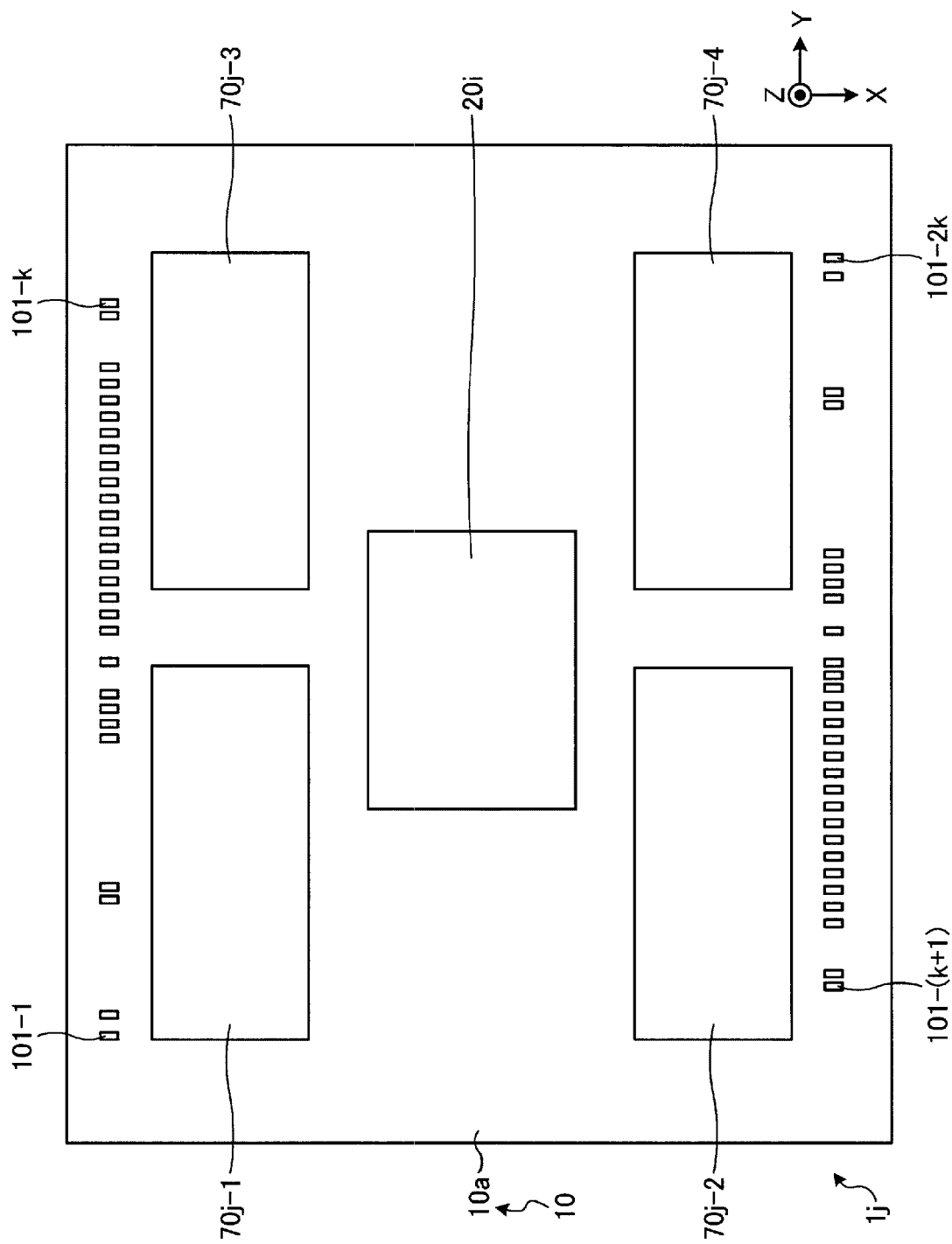
FIG. 6 is a plan view showing a layout configuration of a spacer and a controller chip according to a second modification of the first embodiment.

Alternatively, in a semiconductor device 1j, a plurality of spacers 70j-1 to 70j-4 may be laid out as shown in FIG. 6. FIG. 6 is a plan view showing a layout configuration of the spacers 70j-1 to 70j-4 and the controller chip 20i according to a second modification of the first embodiment.

Areas of the plurality of spacers 70j-1 to 70j-4 may be equal to each other. Outer shape dimensions of the plurality of spacers 70j-1 to 70j-4 may be equal to each other. The spacer 70j-1 and the spacer 70j-3 are disposed on the −X side relative to the controller chip 20i. The spacer 70j-2 and the spacer 70j-4 are disposed on the +X side relative to the controller chip 20i.

The spacer 70j-1 and the spacer 70j-3 may be obtained by removing a part in vicinity of the center of the spacer 70i-1 (see FIG. 4) in the Y direction and dividing the remaining part of the spacer 70i-1 into two parts. The sealing resin 50 can easily fit in the space between the spacer 70j-1 and the spacer 70j-3 and the controller chip 20i when manufacturing the semiconductor device 1j since there is a gap space between the spacer 70j-1 and the spacer 70j-3 in the Y direction.

The spacer 70j-2 and the spacer 70j-4 may be obtained by removing a part in vicinity of the center of the spacer 70i-2 (see FIG. 4) in the Y direction and dividing the remaining part of the spacer 70i-2 into two parts. The sealing resin 50 can easily fit in the space between the spacer 70j-1 and the spacer 70j-3 and the controller chip 20i when manufacturing the semiconductor device 1j since there is a gap space between the spacer 70j-2 and the spacer 70j-4 in the Y direction.

At this time, a stacked structure of the spacers 70j-1 to 70j-4, the controller chip 20i, and the memory chips 40i-1 to 40i-4 may be similar as that in FIG. 5.

In this way, in the semiconductor device 1j, use efficiency of the material of the spacers 70j-1 to 70j-4 can be improved since areas of the spacers 70j-1 to 70j-4 can be equal to each other.

In addition, by setting the outer shape dimensions of the spacers 70j-1 to 70j-4 to be equal to each other, a variation of the thicknesses of the spacer 70j-1 to 70j-4 can be reduced. From this point of view, the thicknesses of the adhesive films 30i-3 and 30i-5 can be reduced, and accordingly a mounting height of the semiconductor device 1j may be easily reduced.

Figure 7:
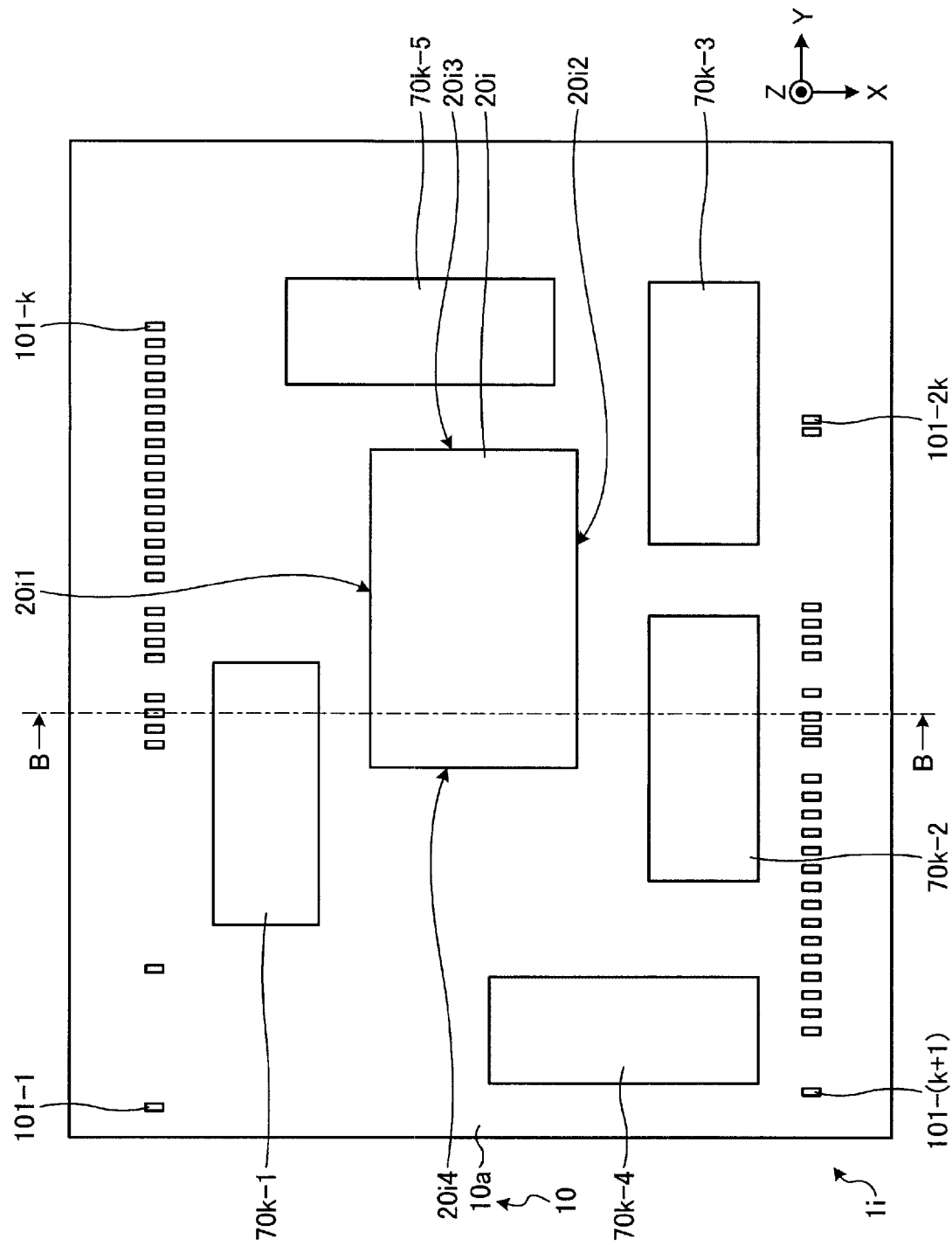
FIG. 7 is a plan view showing a layout configuration of a spacer and a controller chip according to a third modification of the first embodiment.

Alternatively, in a semiconductor device 1k, a plurality of spacers 70k-1 to 70k-5 may be laid out as shown in FIG. 7. FIG. 7 is a plan view showing a layout configuration of the spacers 70k-1 to 70k-5 and the controller chip 20i according to a third modification of the first embodiment.

The controller chip 20i may be arranged in a region including the center of the front surface 10a of the substrate 10 in the XY plane view. Areas of the spacers 70k-1 to 70k-5 may be equal to each other. The spacer 70k-1 is disposed on the −X side relative to the controller chip 20i. The spacer 70k-2 is disposed on the +X side relative to the controller chip 20i. The spacer 70k-3 is disposed on the +X side relative to the controller chip 20i and on the +Y side relative to the spacer 70k-2. The spacer 70k-4 is disposed on the −Y side relative to the controller chip 20i. The spacer 70k-5 is disposed on the +Y side relative to the controller chip 20i.

Figure 8:
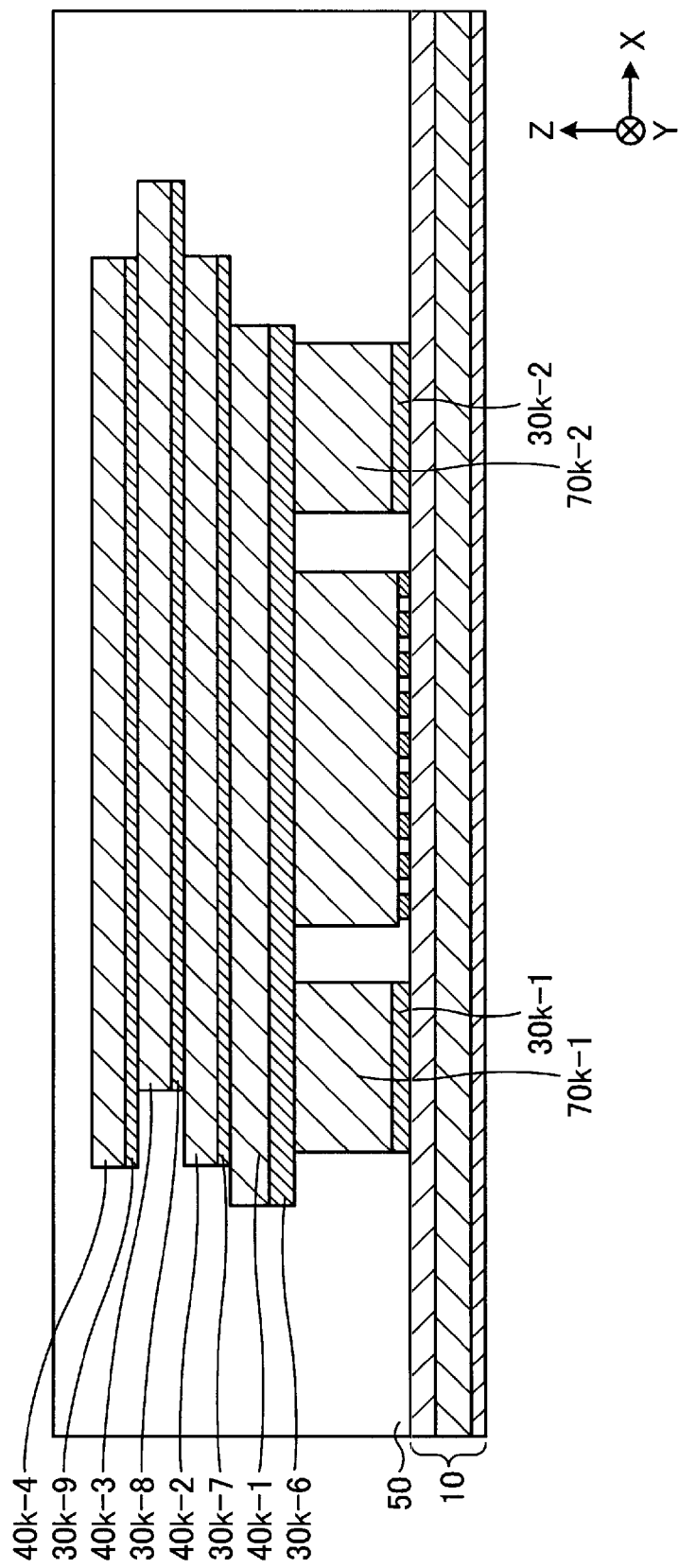
FIG. 8 is a cross-sectional view showing a stacked structure of the spacer, the controller chip and a memory chip according to the third modification of the first embodiment.

At this time, as shown in FIG. 8, a plurality of memory chips 40k-1 to 40k-4 may also be stacked on the +Z side of the spacer 70k-1 to 70k-5 and the controller chip 20i via adhesive films 30k-6 to 30k-9. The spacers 70k-1 to 70k-5 are arranged on the substrate via the adhesive films 30k-1 to 30k-5 in the same manner as in the embodiment. FIG. 8 is a cross-sectional view showing a stacked structure of the spacers 70k-1 to 70k-5, the controller chip 20i, and the memory chips 40k-1 to 40k-4 according to the third modification of the first embodiment, and shows a cross section corresponding to a case where the cross section is cut along a line B-B of FIG. 7. In FIG. 8, illustration of bonding wires is omitted for simplification.

Each of the spacers 70k-1 to 70k-5 may be formed of a material having sufficient strength to support the memory chip 40k-1 via the adhesive film 30k-6. Each of the spacers 70k-1 to 70k-5 may be formed of a material containing a semiconductor (for example, silicon) as a main component, or may be formed of a material containing a resin (for example, polyimide resin) as a main component.

Each of the memory chips 40k-1 to 40k-4 may be electrically connected to the plurality of electrode patterns 101-1 to 101-2k (k is an integer of 2 or more) on the front surface 10a of the substrate 10 shown in FIG. 7 via bonding wires. In the XY plane view, the spacer 70k-1 is disposed between the plurality of electrode patterns 101-1 to 101-k and the controller chip 20i. Each of the spacers 70k-2 and 70k-3 is disposed between the plurality of electrode patterns 101-(k+1) to 101-2k and the controller chip 20i. The spacer 70k-4 is disposed between the plurality of electrode patterns 101-1 to 101-k and the plurality of electrode patterns 101-(k+1) to 101-2k on the −Y side relative to the controller chip 20i. The spacer 70k-5 is disposed between the plurality of electrode patterns 101-1 to 101-k and the plurality of electrode patterns 101-(k+1) to 101-2k on the +Y side relative to the controller chip 20i.

The spacer 70k-1 is disposed parallel to the side 20i1 of the controller chip 20i. The spacer 70k-1 has a rectangular outer shape whose longitudinal direction is in the Y direction, and extends along the side 20i1. Each of the spacers 70k-2 and 70k-3 are disposed parallel to the side 20i2. Each of the spacers 70k-2 and 70k-3 may have a rectangular outer shape whose longitudinal direction is in the Y direction, and extend along the side 20i2. The spacer 70k-4 is disposed parallel to the side 20i4. The spacer 70k-4 has a rectangular outer shape whose longitudinal direction is in the X direction, and extends along the side 20i4. The spacer 70k-5 is disposed parallel to the side 20i3. The spacer 70k-5 may have a rectangular outer shape whose longitudinal direction is in the X direction, and extend along the side 20i3.

Outer dimensions of the spacers 70k-1 to 70k-5 may be equal to each other. The areas of the spacers 70k-1 to 70k-5 may be equal to each other.

In this way, in the semiconductor device 1k, use efficiency of the material (for example, a semiconductor such as silicon) of the spacers 70k-1 to 70k-5 can be improved since areas of the spacers 70k-1 to 70k-5 can be equal to each other.

In addition, by setting the outer shape dimensions of the spacers 70k-1 to 70k-5 to be equal to each other, a variation of the thicknesses of the spacer 70k-1 to 70k-5 can be reduced. From this point of view, the thicknesses of the adhesive film 30k-6 can be reduced, and accordingly a mounting height of the semiconductor device 1k may be easily reduced.

Figure 9:
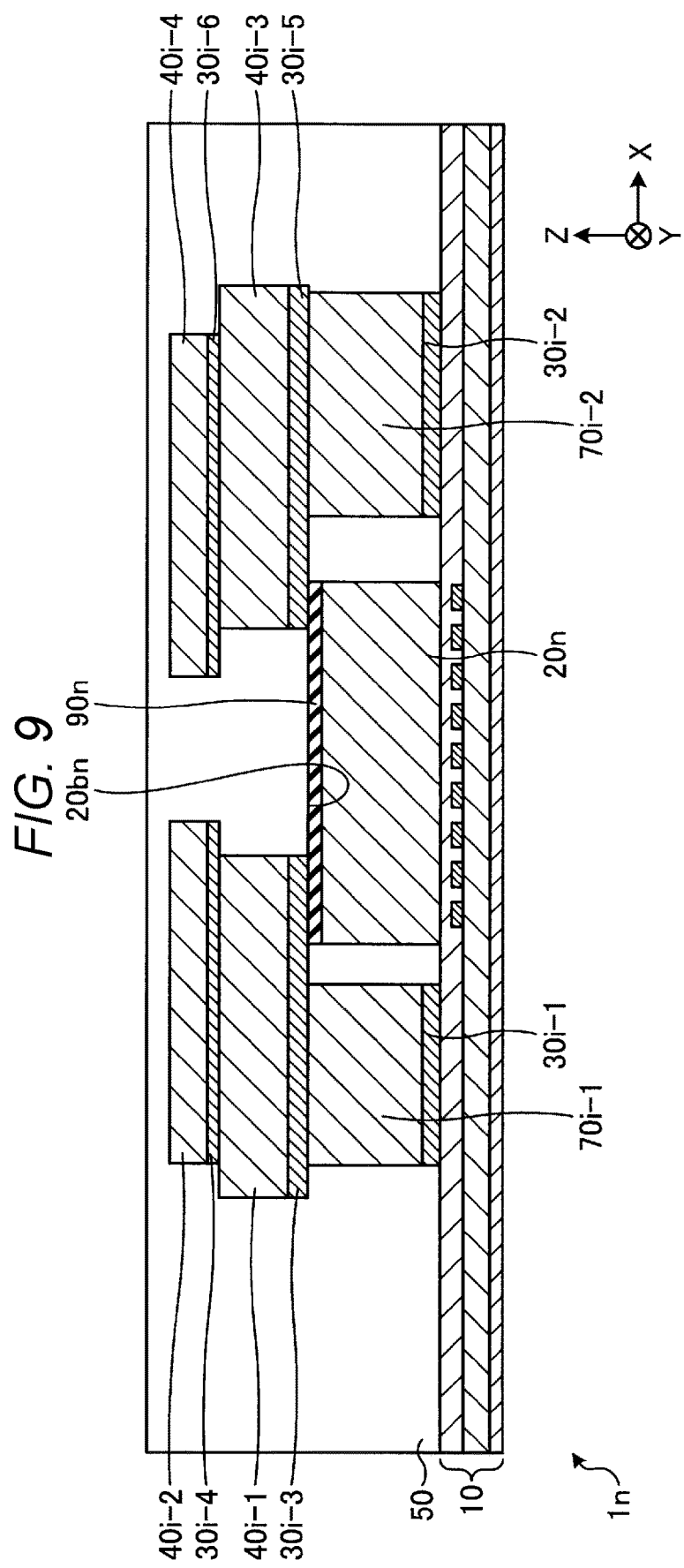
FIG. 9 is a cross-sectional view showing a stacked structure of a spacer, a controller chip and a memory chip according to a fourth modification of the first embodiment.

Alternatively, as shown in FIG. 9, in a semiconductor device 1n, a spacer 90n may be disposed on aback surface 20bn of a controller chip 20n. FIG. 9 is a cross-sectional view showing a stacked structure of the spacers 70i-1, 70i-2, and 90n, the controller chip 20n, and the memory chips 40i-1 to 40i-4 according to a fourth modification of the first embodiment, and shows a cross section corresponding to a case where the cross section is cut along the line A-A of FIG. 4. In FIG. 9, illustration of bonding wires is omitted for simplification.

The spacer 90n may be formed of a material (for example, a material having an intermediate thermal expansion coefficient between those of the semiconductor and the first resin, or a material capable of reducing stress caused by the difference in thermal expansion coefficient) capable of reducing a difference in thermal expansion coefficient between a back surface 20bn of the controller chip 20n and the sealing resin 50, and may be formed of, for example, a material containing a polyimide resin as a main component. The spacer 90n and the back surface 20bn of the controller chip 20n may be adhered to each other by an adhesive film (not shown). The plurality of memory chips 40i-1 and 40i-2 are stacked on the +Z side of the spacer 70i-1 and the spacer 90n via the adhesive films 30i-3 and 30i-4.

In a manufacturing process of the semiconductor device 1n, the spacer 90n may be attached to a wafer including the controller chip 20n before integrated into a single piece. Thereafter, the spacer 90n and the controller chip 20n may be integrated together into the single piece, and then the spacer 90n and the controller chip 20n are integrally mounted on the substrate 10. Therefore, the lower limit heights H20b_min and the upper limit height H20b_max shown in FIG. 2 and FIG. 3 may be used as the height of the +Z-side surface of a member in which the spacer 90n and the controller chip 20n are integrated (that is, the +Z-side surface of the spacer 90n).

In the configuration of FIG. 5, adhesive strength between the back surface 20bi of the controller chip 20i and the sealing resin 50 is small, and the sealing resin 50 may peel from the back surface 20bi after sealing.

In contrast, in the configuration of FIG. 9, adhesion between the back surface 20bn of the controller chip 20n and the sealing resin 50 can be improved via the spacer 90n, and the sealing resin 50 can be prevented from peeling from the back surface 20bi side (the +Z side surface of the spacer 90n) after sealing.

Second Embodiment

A semiconductor device according to a second embodiment will be described. Hereinafter, the description will focus mainly on parts different from those of the first embodiment.

In the first embodiment, a manufacturing method of the semiconductor device 1 is not particularly limited.

For example, when manufacturing the semiconductor device 1, the controller chip 20 is mounted on the substrate 10 via a plurality of bump electrodes, and the spacers 70 may be mounted after filling the gaps between the plurality of bump electrodes with underfill.

When the controller chip 20 is mounted, a molten sheet (Bleed) of the adhesive resin 22 may flow out around the controller chip 20 after the adhesive resin 22 is filled. After that, when the spacers 70 are mounted on the molten sheet (Bleed), the adhesion of the spacers 70 to the substrate 10 may deteriorate and the spacers 70 may peel. When the spacers 70 peel, stress is applied to other chips and accordingly an electrical connection failure may occur, for example, one of electrical connection paths of bonding wires between electrode pads of the memory chips and the electrode patterns on the substrate is interrupted due to disconnection and/or peeling.

Also, a variation in a height direction may increase due to a thickness of the molten sheet (Bleed). That is, a difference in height between an upper surface of the controller chip 20 and an upper surface of the spacers 70 on the substrate 10 is increased, a thickness of the adhesive film 30 to be stacked thereon is greatly increased in order to eliminate the difference in height, and amounting height from the substrate 10 to an uppermost memory chip 40 may be increased.

Therefore, in the second embodiment, as shown in FIG. 10A to FIG. 10D, by mounting the controller chip 20 after the spacers 70 are mounted on the substrate 10 in the manufacturing method of the semiconductor device 1, the molten sheet (Bleed) of the adhesive resin 22 is prevented from being interposed between the spacers 70 and the substrate 10. FIG. 10A to FIG. 10D are process sectional views showing a manufacturing method of the semiconductor device 1 according to the second embodiment.

Figure 10A:
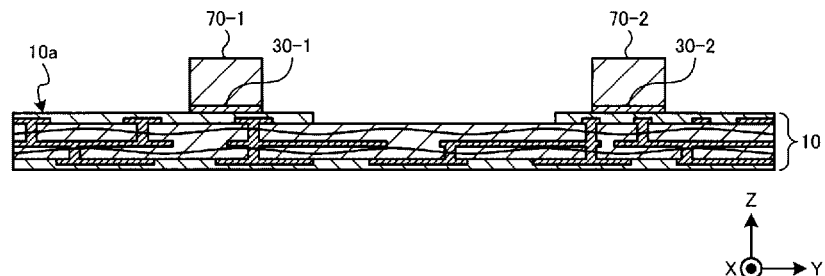
FIG. 10A to FIG. 10D are process sectional views showing a manufacturing method of a semiconductor device according to a second embodiment.

In a step of FIG. 10A, the adhesive films 30-1 and 30-2 are disposed in regions where the spacers 70-1 and 70-2 are to be mounted on the front surface 10a of the substrate 10. Then, the spacers 70-1 and 70-2 are disposed on the +Z side of the adhesive films 30-1 and 30-2. Accordingly, the spacers 70-1 and 70-2 can be adhered to and mounted on the front surface 10a of the substrate 10 via the adhesive films 30-1 and 30-2.

Figure 10B:
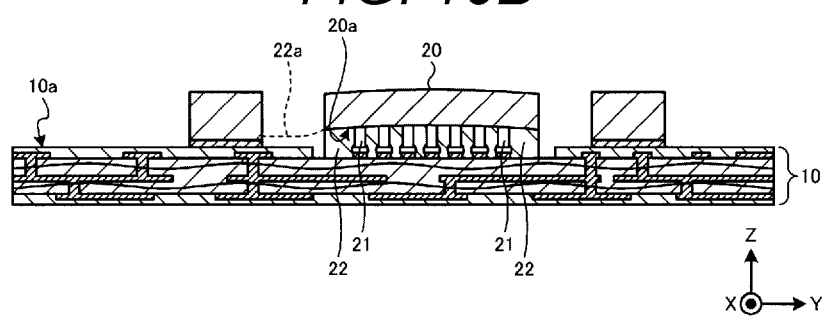

In a step of FIG. 10B, the controller chip 20 is disposed in a region between the spacers 70-1 and 70-2 on the front surface 10a of the substrate 10 via the plurality of bump electrodes 21. At this time, the controller chip 20 is disposed on the front surface 10a of the substrate 10 in a state where the front surface 20a of the controller chip 20 faces the front surface 10a of the substrate 10. Then, gaps between the bump electrodes 21 between the front surface 10a of the substrate 10 and the front surface 20a of the controller chip 20 may be filled with the adhesive resin 22. Thereafter, the plurality of bump electrodes 21 may be heated to a first temperature via the substrate 10 and melted to some extent.

At this time, there is a possibility that a molten sheet (Bleed) 22a of the adhesive resin 22 flows out. However, there is no molten sheet (Bleed) of the adhesive resin 22 interposed between the spacer 70 and the substrate 10 since the spacer 70 is already mounted on the surface 10a of the substrate 10 via the adhesive film 30.

Figure 10C:
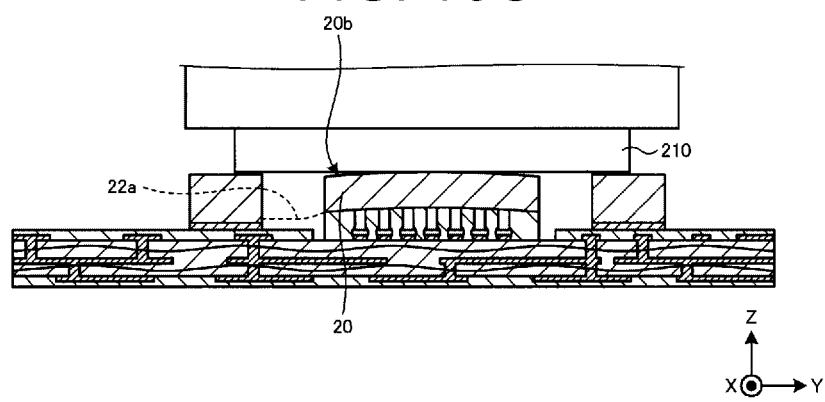

In a step of FIG. 10C, a bonding head 210 may press the back surface 20b of the controller chip 20, and the plurality of bump electrodes 21 may be pressed against electrodes on the surface 10a of the substrate 10. At the same time, the plurality of bump electrodes 21 may be heated to a second temperature higher than the first temperature via the substrate 10 and bonded to the electrodes on the surface 10a.

At this time, the second temperature may be higher than a glass transition point of the adhesive resin 22. If the adhesive resin 22 is heated to a temperature lower than the glass transition point, there is a possibility that the adhesive resin 22 contracts thermally and the substrate 10 is bent. On the other hand, when the adhesive resin 22 is heated to a temperature higher than the glass transition point, the adhesive resin 22 may become amorphous and stress due to heat contraction may be released, and therefore the substrate 10 may be returned to a flat state.

Figure 10D:
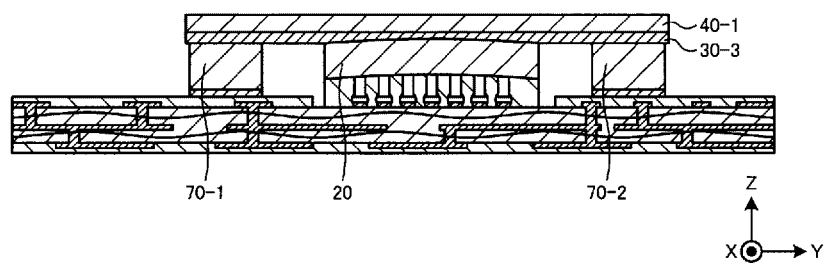

In a step of FIG. 10D, the adhesive film 30-3 is disposed on the +Z side of the controller chip 20 and the spacers 70-1 and 70-2. Then, the memory chip 40-1 is disposed on the +Z side of the adhesive film 30-3. Accordingly, the memory chip 40-1 can be bonded to and mounted on the +Z side of the controller chip 20 and the spacers 70-1 and 70-2 via the adhesive film 30-3.

Thereafter, the memory chips 40-2 to 40-8 may be bonded to and mounted on the +Z side via the adhesive films 30-4 to 30-10. Accordingly, the semiconductor device 1 shown in FIG. 1 is obtained.

As described above, in the second embodiment, the spacers 70 are mounted on the front surface 10a of the substrate 10, and then the controller chip 20 is mounted on the front surface 10a of the substrate 10. Accordingly, electrical connection failure can be prevented and the mounting height of the semiconductor device 1 can be easily reduced since the molten sheet (Bleed) of the adhesive resin 22 can be prevented from being interposed between the spacers 70 and the substrate 10.

In the steps of FIG. 10A and FIG. 10B, a height of each spacer 70 from the main surface 10a of the substrate 10 may be within a range between an upper limit and a lower limit of the height of the controller chip 20. Therefore, in the step of FIG. 10C, the bonding head 210 may not be able to pressurize a part of the back surface 20b of the controller chip 20 that is lower than the surface 70a of the spacer 70, and the bonding between the bump electrodes 21 and the electrodes on the surface 10a of the substrate 10 may be insufficient.

In consideration of this point, in the semiconductor device, the height of each spacer from the main surface of the substrate may be set to be lower than the lower limit of the height of the controller chip.

Figure 11:
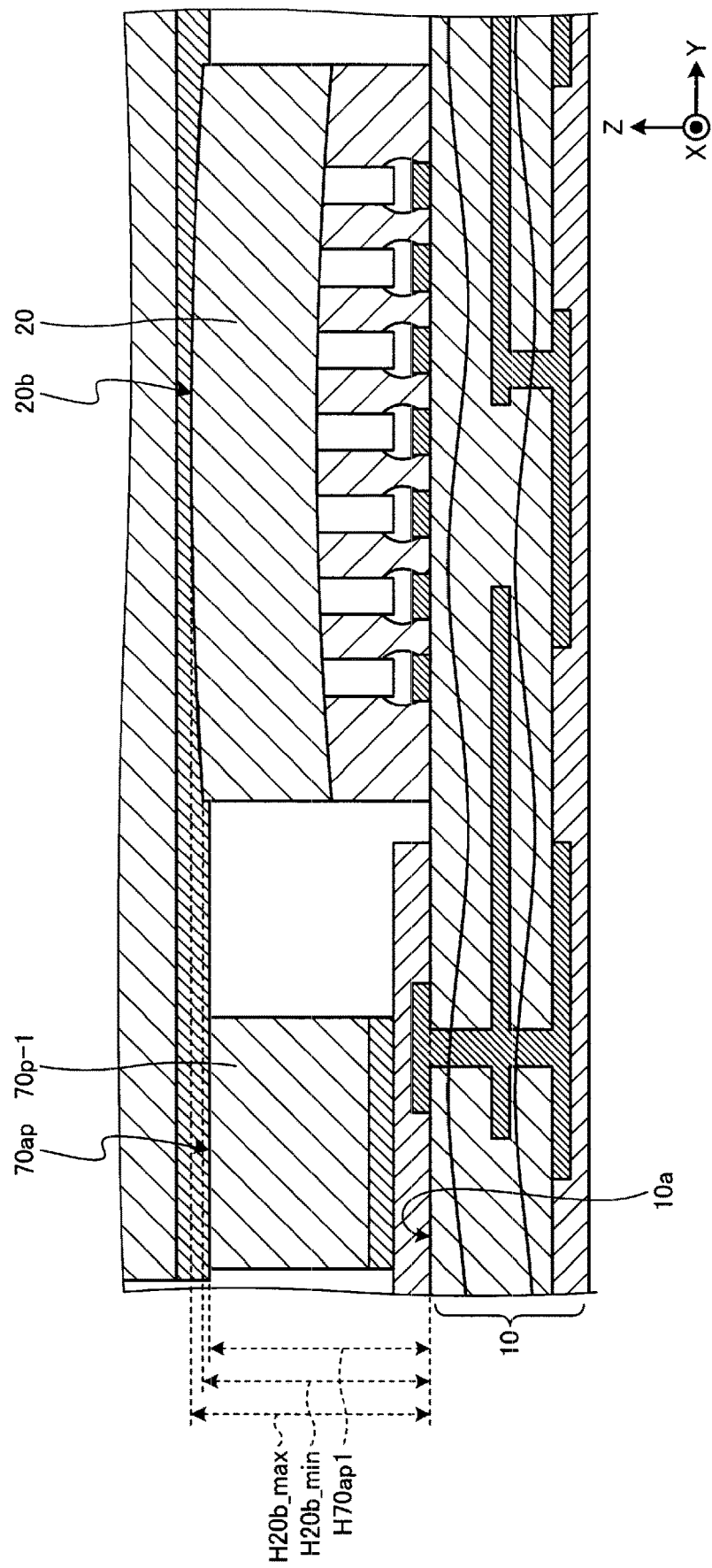
FIG. 11 is an enlarged cross-sectional view showing heights of a spacer and a controller chip according to a modification of the second embodiment.

For example, spacers 70p-1 and 70p-2 may be constituted as shown in FIG. 11 and FIG. 12. FIG. 11 is an enlarged cross-sectional view showing the height of the spacer 70p-1 and the controller chip 20 according to a modification of the second embodiment. FIG. 12 is an enlarged cross-sectional view showing the height of the spacer 70p-2 and the controller chip 20 according to the modification of the second embodiment. A height H70ap1 of the surface 70ap of the spacer 70p-1 from the front surface 10a of the substrate 10 is lower than the lower limit height H20b_min of the back surface 20b of the controller chip 20. A height H70ap2 of the surface 70ap of the spacer 70p-2 from the front surface 10a of the substrate 10 is lower than the lower limit height H20b_min of the back surface 20b of the controller chip 20. Accordingly, in the step of FIG. 10C, the bonding head 210 can easily pressurize the back surface 20b of the controller chip 20.

At this time, a difference between the lower limit height H20b_min and the height H70ap2 may be smaller than a difference between the upper limit height H20b_max and the lower limit height H20b_min. That is, the following Expression (1) may be satisfied.

$$H20b\_min - H70ap2 < h20b\_max - H20b\_min \quad (1)$$

Accordingly, in the step of FIG. 10C, the bonding head 210 can easily pressurize the back surface 20b of the controller chip 20, and the difference in height between the back surface of the controller chip 20 and the front surface of the spacer can be prevented.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor device comprising:
   a substrate having a main surface;
   a first semiconductor chip having a first front surface and a first back surface, the first front surface being mounted on the main surface via a plurality of bump electrodes;
   a first spacer having a second front surface and a second back surface, the second back surface being mounted on the main surface, and a height of the second front surface from the main surface being within a range between a highest height and a lowest height of the first back surface from the main surface;
   a second spacer having a third front surface and a third back surface, the third back surface being mounted on the main surface, and a height of the third front surface from the main surface being within a range between the highest height and the lowest height of the first back surface from the main surface;
   a first adhesive film that covers the main surface wherein the first spacer is stacked on the first adhesive film;
   a second adhesive film that covers the main surface wherein the second spacer is stacked on the second adhesive film;
   a third adhesive film that covers at least the first back surface and the second front surface; and
   a second semiconductor chip that has a fourth front surface and a fourth back surface, the fourth back surface being adhered to the third adhesive film, wherein the second semiconductor chip is mounted on a plurality of electrode patterns disposed on the main surface via a plurality of bonding wires, wherein
   a thickness of the third adhesive film is equal to or larger than a thickness of the first adhesive film, and
   the thickness of the third adhesive film is equal to or larger than a thickness of the second adhesive film.

2. The semiconductor device according to claim 1, wherein
   an area of the first spacer and an area of the second spacer are equal to each other in a plan view,
   an outer edge of the first semiconductor chip has a first side and a second side facing the first side,
   the first spacer is disposed parallel to the first side in a plan view, and
   the second spacer is disposed parallel to the second side in the plan view.

3. The semiconductor device according to claim 2, wherein
   the first spacer extends along the first side in the plan view, and
   the second spacer extends along the second side in the plan view.

4. The semiconductor device according to claim 1, wherein
   an area of the first spacer and an area of the second spacer are equal to each other in a plan view,
   an outer edge of the first semiconductor chip has a first side and a second side intersecting the first side,
   the first spacer is disposed parallel to the first side in a plan view, and
   the second spacer is disposed parallel to the second side in the plan view.

5. The semiconductor device according to claim 4, wherein
   the first spacer extends along the first side in the plan view, and
   the second spacer extends along the second side in the plan view.

6. The semiconductor device according to claim 1, further comprising:
   a fourth adhesive film that covers the fourth front surface; and
   a third semiconductor chip that has a fifth front surface and a fifth back surface, the fifth back surface being adhered to the fourth adhesive film, wherein the third semiconductor chip is mounted on the plurality of electrode patterns disposed on the main surface via the plurality of bonding wires, wherein
   the thickness of the third adhesive film is equal to or larger than a thickness of the fourth adhesive film.

7. A semiconductor device comprising:
   a substrate having a main surface;
   a first semiconductor chip that having a first front surface and a first back surface, the first front surface being mounted on the main surface via a plurality of bump electrodes;
   a first spacer that has a second front surface and a second back surface, the second back surface being mounted on the main surface, and a height of the second front surface from the main surface being lower than a lowest height of the first back surface from the main surface;
   a second spacer that has a third front surface and a third back surface, the third back surface being mounted on the main surface, and a height of the third front surface from the main surface being lower than a lowest height of the first back surface from the main surface;
   an adhesive film that covers at least one of the first back surface, the second front surface, or the third front surface; and
   a second semiconductor chip that has a fourth front surface and a fourth back surface, the fourth back surface being adhered to the adhesive film, wherein the second semiconductor chip is mounted on a plurality of electrode patterns disposed on the main surface via a plurality of bonding wires.

8. The semiconductor device according to claim 7, wherein
   an area of the first spacer and an area of the second spacer are equal to each other in a plan view,
   an outer edge of the first semiconductor chip has a first side and a second side facing the first side, the first spacer is disposed parallel to the first side in a plan view, and the second spacer is disposed parallel to the second side in the plan view.

9. The semiconductor device according to claim 8, wherein the first spacer extends along the first side in the plan view, and the second spacer extends along the second side in the plan view.

10. The semiconductor device according to claim 7, wherein an area of the first spacer and an area of the second spacer are equal to each other in a plan view, an outer edge of the first semiconductor chip has a first side and a second side intersecting the first side, the first spacer is disposed parallel to the first side in a plan view, and the second spacer is disposed parallel to the second side in the plan view.

11. The semiconductor device according to claim 10, wherein the first spacer extends along the first side in the plan view, and the second spacer extends along the second side in the plan view.

\* \* \* \* \*